United States Patent
Oh et al.

(10) Patent No.: US 12,289,880 B2
(45) Date of Patent: Apr. 29, 2025

(54) SEMICONDUCTOR DEVICES HAVING A GRAPHENE PATTERN BETWEEN THE FIRST CONDUCTIVE PATTERN AND THE BIT LINE CAPPING

(71) Applicant: Samsung Electronics Co., Ltd., Suwon-si (KR)

(72) Inventors: Seran Oh, Hwaseong-si (KR); Sukhoon Kim, Hwaseong-si (KR); Sungjoo An, Yongin-si (KR); Yeonuk Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 459 days.

(21) Appl. No.: 17/892,275

(22) Filed: Aug. 22, 2022

(65) Prior Publication Data

US 2023/0232611 A1    Jul. 20, 2023

(30) Foreign Application Priority Data

Jan. 18, 2022  (KR) ......................... 10-2022-0007453

(51) Int. Cl.
  *H10B 12/00*  (2023.01)
(52) U.S. Cl.
  CPC .......... *H10B 12/315* (2023.02); *H10B 12/34* (2023.02); *H10B 12/482* (2023.02)
(58) Field of Classification Search
  CPC .. H10B 12/0335; H10B 12/315; H10B 12/34; H10B 12/482; G11C 11/4097
  USPC ................................................. 257/906, 908
  See application file for complete search history.

(56) References Cited

U.S. PATENT DOCUMENTS

| | | | |
|---|---|---|---|
| 8,476,765 B2 | 7/2013 | Zhang et al. | |
| 9,209,136 B2 | 12/2015 | Barth | |
| 9,337,149 B2 | 5/2016 | Im et al. | |
| 9,786,760 B1 | 10/2017 | Bonilla et al. | |

(Continued)

FOREIGN PATENT DOCUMENTS

| | | | |
|---|---|---|---|
| KR | 20010097949 A | 11/2001 | |
| KR | 100668836 B1 | 1/2007 | |

(Continued)

OTHER PUBLICATIONS

"Formation and distribution of compounds at the Ru—Si(001) ultrathin film interface." L. Pasquali Et al., Journal of Applied Physics 105, 044304 2009.

(Continued)

*Primary Examiner* — Hoai V Pham
(74) *Attorney, Agent, or Firm* — Myers Bigel, P.A.

(57) ABSTRACT

A semiconductor device includes a substrate including a plurality of active patterns and a bit line intersecting at least one of the plurality of active patterns on the substrate and extending in a first direction. The bit line includes a first conductive pattern extending in the first direction, a bit line capping pattern extending in the first direction on the first conductive pattern, and a graphene pattern extending in the first direction between the first conductive pattern and the bit line capping pattern. The first conductive pattern may include ruthenium (Ru). The semiconductor device may also include one or more bit line contacts arranged in the first direction under the bit line, the one or more bit line contacts electrically connected to a respective one of the plurality of active patterns.

20 Claims, 18 Drawing Sheets

(56) References Cited

U.S. PATENT DOCUMENTS

| | | |
|---|---|---|
| 10,290,745 B2 | 5/2019 | Yamazaki et al. |
| 11,081,489 B2 | 8/2021 | Nam et al. |
| 2008/0242084 A1 | 10/2008 | Kim et al. |
| 2013/0299988 A1 | 11/2013 | Bonilla et al. |
| 2018/0158828 A1 | 6/2018 | Han et al. |
| 2022/0278235 A1 | 9/2022 | Yamazaki et al. |
| 2022/0328486 A1 | 10/2022 | Onuki et al. |
| 2023/0262955 A1* | 8/2023 | Lu .................. H01L 29/4958 257/295 |

FOREIGN PATENT DOCUMENTS

| | | |
|---|---|---|
| KR | 102051517 B1 | 12/2019 |
| TW | 201633548 A | 9/2016 |
| TW | 202121691 A | 6/2021 |
| TW | 202129877 A | 8/2021 |

OTHER PUBLICATIONS

"The Ruthenium-Silicon system," L. Perring Et al., Journal of Alloys and Compounds 284 (1999) 198-205.

* cited by examiner

FIG. 1
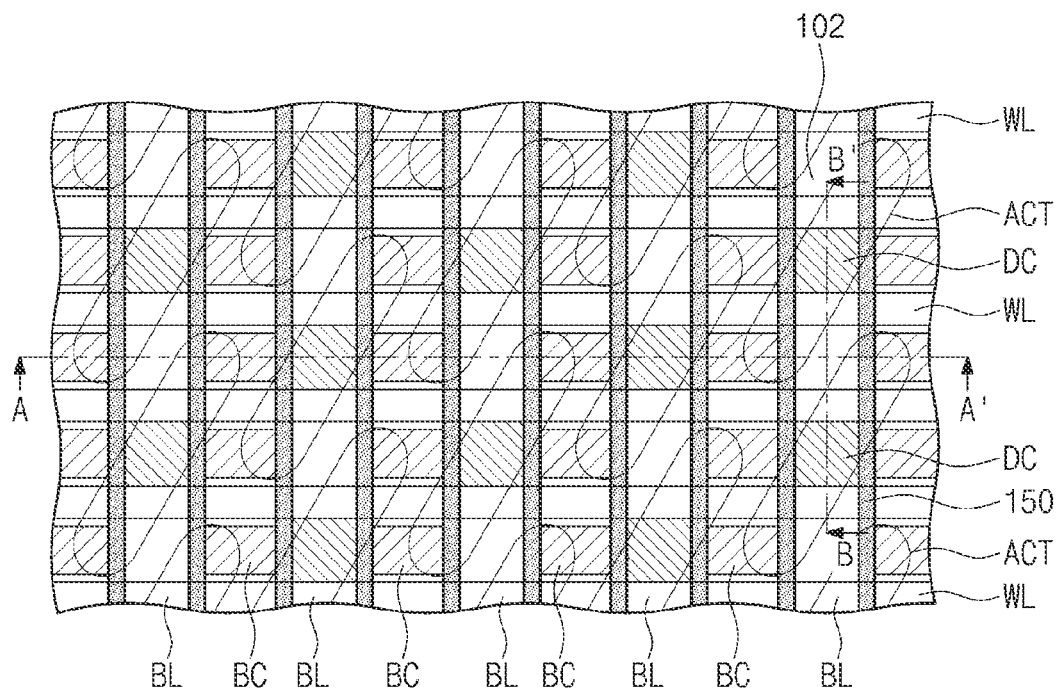
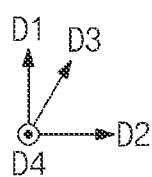

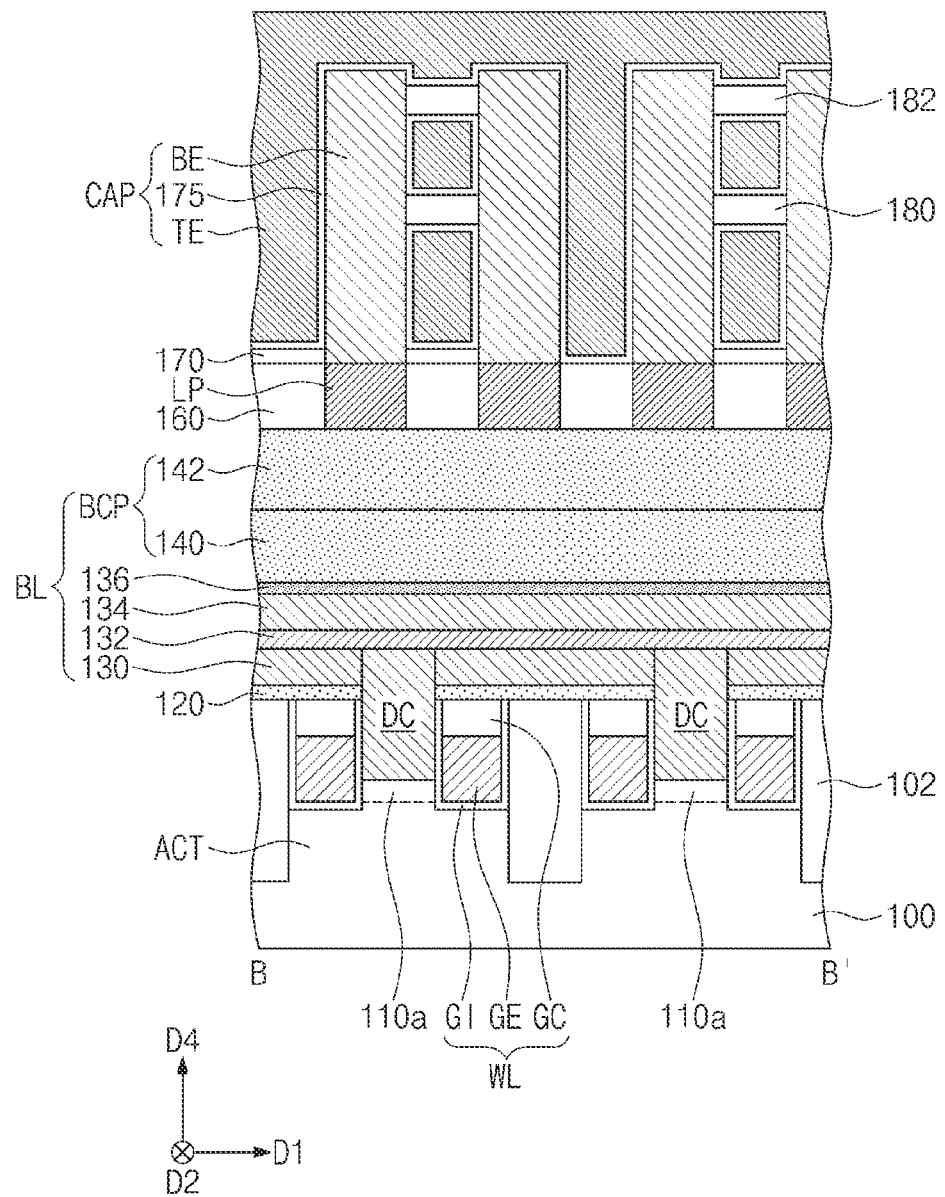

SEMICONDUCTOR DEVICES HAVING A GRAPHENE PATTERN BETWEEN THE FIRST CONDUCTIVE PATTERN AND THE BIT LINE CAPPING

REFERENCE TO PRIORITY APPLICATION

This U.S. non-provisional patent application claims priority under 35 U.S.C. § 119 to Korean Patent Application No. 10-2022-0007453, filed on Jan. 18, 2022, in the Korean Intellectual Property Office, the entire disclosure of which is hereby incorporated by reference.

BACKGROUND

The present disclosure relates to semiconductor devices and methods of manufacturing the same, and more particularly, to semiconductor memory devices and methods of manufacturing the same.

Semiconductor devices are widely used in an electronic industry because of their small sizes, multi-functional characteristics, and/or low manufacturing costs, among other reasons. Semiconductor devices may include any one of semiconductor memory devices for storing logical data, semiconductor logic devices for processing logical data, and hybrid semiconductor devices having both the function of the semiconductor memory devices and the function of the semiconductor logic devices.

High-speed and low-voltage semiconductor devices are desirable to satisfy characteristics (e.g., high speed and/or low power consumption) of electronic devices including semiconductor devices. Semiconductor devices have been highly integrated to meet these characteristics. Reliability of semiconductor devices may be deteriorated by the high integration density of the semiconductor devices. However, high-reliability semiconductor devices have been increasingly demanded with the development of the electronic industry. Thus, various research has been conducted to improve reliability of semiconductor devices.

SUMMARY

Embodiments of the present disclosure may provide a semiconductor device with improved electrical characteristics and a method of manufacturing the same.

Embodiments of the present disclosure may also provide a semiconductor device with excellent reliability and a method of manufacturing the same.

In an aspect, a semiconductor device may comprise: a substrate comprising a plurality of active patterns; and a bit line intersecting at least one of the plurality of active patterns on the substrate and extending in a first direction. The bit line may comprise a first pattern extending in the first direction; a bit line capping pattern extending in the first direction on the first conductive pattern; and a graphene pattern extending in the first direction between the first conductive pattern and the bit line capping pattern. The first conductive pattern may include ruthenium (Ru). In some embodiments, the semiconductor device may include one or more bit line contacts arranged in the first direction under the bit line, the one or more bit line contacts electrically connected to a respective one of the plurality of active patterns.

In an aspect, a semiconductor device may comprise: a substrate comprising a plurality of active patterns; a plurality of bit lines intersecting at least one of the plurality of active patterns on the substrate, each of the plurality of bit lines extending in a first direction and spaced apart from each other in a second direction, the first and second directions being parallel to a bottom surface of the substrate and intersecting each other; one or more bit line contacts arranged in the first direction under each of the plurality of bit lines, each of the one or more bit line contacts electrically connected to a respective corresponding active pattern of the plurality of active patterns; a plurality of storage node contacts spaced apart from each other in the first direction between the bit lines, each of the plurality of storage node contacts electrically connected to end portions of a respective corresponding active pattern of the plurality of active patterns; and a capacitor structure connected to one or more of the plurality of storage node contacts. Each of the plurality of bit lines may comprise a first conductive pattern comprising ruthenium (Ru) and extending in the first direction on the one or more bit line contacts; a bit line capping pattern comprising a silicon compound and extending in the first direction on the first conductive pattern; and a graphene pattern extending in the first direction between the first conductive pattern and the bit line capping pattern.

In another aspect, a semiconductor device may comprise: a substrate comprising a plurality of active patterns; a plurality of bit lines intersecting at least one of the plurality of active patterns on the substrate, the plurality of bit lines extending in a first direction and spaced apart from each other in a second direction, the first and second directions being parallel to a bottom surface of the substrate and intersecting each other; and one or more bit line contacts arranged in the first direction under each of the plurality of bit lines, each of the one or more bit line contacts electrically connected to a respective corresponding active pattern of the plurality of active patterns. Each of the plurality of bit lines may comprise: a conductive pattern comprising ruthenium (Ru) and extending in the first direction on the one or more bit line contacts; a bit line capping pattern comprising a silicon compound and extending in the first direction on the conductive pattern; and at least one graphene pattern extending in the first direction between the conductive pattern and the bit line capping pattern. The at least one graphene pattern may comprise at least one graphene layer having a two-dimensional carbon material in which carbon atoms are bonded to each other in a honeycomb structure. A distance between adjacent carbon atoms of the graphene layer may be less than a size of a silicon atom. The graphene pattern may be configured to prevent ruthenium silicide from being formed between the conductive pattern and the bit line capping pattern.

BRIEF DESCRIPTION OF THE DRAWINGS

FIG. 1 is a plan view illustrating a semiconductor device according to some embodiments of the present disclosure.

FIG. 3 is a cross-sectional view taken along a line B-B' of FIG. 1.

DETAILED DESCRIPTION

Example embodiments of the present disclosure will now be described more fully with reference to the accompanying drawings.

Figure 2:
FIG. 2 is a cross-sectional view taken along a line A-A' of FIG. 1.

FIG. 1 is a plan view illustrating a semiconductor device according to some embodiments of the present disclosure. FIG. 2 is a cross-sectional view taken along a line A-A' of FIG. 1, and FIG. 3 is a cross-sectional view taken along a line B-B' of FIG. 1. FIGS. 4A to 4D are enlarged views of a portion 'P1' of FIG. 2.

Referring to FIGS. 1, 2 and 3, a substrate 100 may be provided. The substrate 100 may be a semiconductor substrate such as a silicon substrate, a germanium substrate, or a silicon-germanium substrate. A plurality of active patterns ACT may be on the substrate 100. The active patterns ACT may be spaced apart from each other in a first direction D1 and a second direction D2, which are parallel to a bottom surface 100L of the substrate 100. The first direction D1 and the second direction D2 may intersect each other. In some embodiments, each of the active patterns ACT may have a bar shape extending in a third direction D3 which is parallel to the bottom surface 100L of the substrate 100 and intersects both the first direction D1 and the second direction D2. Each of the active patterns ACT may be a portion of the substrate 100 which protrudes from the substrate 100 in a fourth direction D4 perpendicular to the bottom surface 100L of the substrate 100. The first direction D1, second direction D2, and third direction D3 may be horizontal directions, and the fourth direction D4 may be a vertical direction in some embodiments.

A device isolation layer 102 may be on the substrate 100 and may define the active patterns ACT. The device isolation layer 102 may be between the active patterns ACT. For example, the device isolation layer 102 may include silicon oxide, silicon nitride, and/or silicon oxynitride.

A plurality of word lines WL may be on the substrate 100 and may intersect the active patterns ACT and the device isolation layer 102. The word lines WL may be spaced apart from each other in the first direction D1 and may extend in the second direction D2. The word lines WL may be word lines buried in the substrate 100 and may be buried in the active patterns ACT and the device isolation layer 102.

Each of the word lines WL may include a gate electrode GE extending into and/or penetrating upper portions of the active patterns ACT and the device isolation layer 102, a gate dielectric pattern GI between the gate electrode GE and the active patterns ACT and between the gate electrode GE and the device isolation layer 102, and a gate capping pattern GC on a top surface of the gate electrode GE. A top surface of the gate capping pattern GC may be coplanar with top surfaces of the active patterns ACT. For example, the top surface of the gate capping pattern GC may be located at substantially the same height as the top surfaces of the active patterns ACT (for example, the same distance away from the bottom surface 100L of the substrate 100).

The gate electrode GE may include a conductive material. For example, the conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). In example embodiments, the gate dielectric pattern GI may include a silicon oxide layer, a silicon nitride layer, and/or a silicon oxynitride layer. In example embodiments, the gate capping pattern GC may include a silicon oxide layer, a silicon nitride layer, and/or a silicon oxynitride layer.

A first dopant injection region 110a and second dopant injection regions 110b may be provided in each of the active patterns ACT. The second dopant injection regions 110b may be spaced apart from each other in the second direction D2 with the first dopant injection region 110a interposed therebetween. The first dopant injection region 110a may be provided between a pair of the word lines WL intersecting each of the active patterns ACT. The second dopant injection regions 110b may be spaced apart from each other in the second direction D2 with the pair of word lines WL interposed therebetween. The first dopant injection region 110a and the second dopant injection regions 110b may include dopants having the same conductivity type.

An insulating layer 120 may be on the substrate 100 and may at least partially cover the active patterns ACT, the device isolation layer 102, and the word lines WL. For example, the insulating layer 120 may include a single layer or a multi-layer structure including at least one of a silicon oxide layer, a silicon nitride layer, or a silicon oxynitride layer.

A plurality of bit lines BL may be on the substrate 100 and on the insulating layer 120. The bit lines BL may intersect the word lines WL. The bit lines BL may extend in the first direction D1 and may be spaced apart from each other in the second direction D2. Each of the bit lines BL may include lower conductive patterns 130 arranged in the first direction D1 on the insulating layer 120; a lower barrier pattern 132 extending in the first direction D1 on the lower conductive patterns 130; and an upper (or first) conductive pattern 134, a diffusion barrier pattern 136, and a bit line capping pattern BCP which are sequentially stacked on the lower barrier pattern 132. Each of the upper conductive pattern 134, the diffusion barrier pattern 136, and the bit line capping pattern BCP may extend in the first direction D1. The bit line capping pattern BCP may include a lower capping pattern 140 and an upper capping pattern 142 which are sequentially stacked on the diffusion barrier pattern 136, and each of the lower capping pattern 140 and the upper capping pattern 142 may extend in the first direction D1.

The lower (or second) conductive patterns 130 may include dopant-doped or undoped polysilicon, and the lower barrier pattern 132 may include at least one of a conductive metal nitride (e.g., titanium nitride, tantalum nitride, or tungsten nitride) or a metal silicide. The upper conductive pattern 134 may include at least one of a metal (e.g., ruthenium, tungsten, titanium, or tantalum) or a conductive metal nitride (e.g., titanium nitride, tantalum nitride, or tungsten nitride). For example, the upper conductive pattern 134 may include ruthenium (Ru). The bit line capping pattern BCP may include a silicon compound. Each of the lower capping pattern 140 and the upper capping pattern 142 may include the silicon compound, and for example, the silicon compound may include at least one of single-crystalline silicon, dopant-doped or undoped polysilicon, silicon oxide (SiOx), silicon carbide (SiC), silicon nitride (SiN), silicon oxycarbide (SiOC), or silicon oxycarbonitride (SiOCN).

Figure 4A:
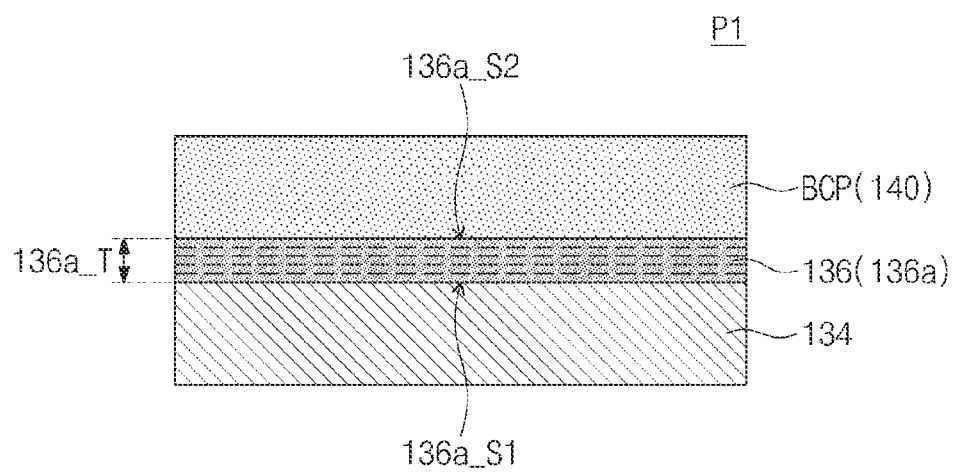
FIGS. 4A to 4D are enlarged views of a portion 'P1' of FIG. 2.

Referring to FIGS. 2 and 4A, the diffusion barrier pattern 136 may include a graphene pattern 136a. The graphene pattern 136a may be a single graphene layer between the upper conductive pattern 134 and the bit line capping pattern BCP (i.e., the lower capping pattern 140 of the BCP) or the graphene pattern 136a may include a plurality of graphene layers stacked in the fourth direction D4 between the upper conductive pattern 134 and the bit line capping pattern BCP (i.e., the lower capping pattern 140 of the BCP). In example embodiments, the number of the plurality of graphene layers may range from 2 to 20. The graphene pattern 136a may have a thickness 136a_T in the fourth direction D4, and for example, the thickness 136a_T of the graphene pattern 136a may be equal to or less than one hundred Angstroms (100 Å). The graphene pattern 136a may have a first surface 136a_S1 and a second surface 136a_S2, which are opposite to each other in the fourth direction D4. In some embodiments, the first surface 136a_S1 of the graphene pattern 136a may be in contact with the upper conductive pattern 134, and the second surface 136a_S2 of the graphene pattern 136a may be in contact with the bit line capping pattern BCP (i.e., the lower capping pattern 140 of the BCP).

Figure 4B:
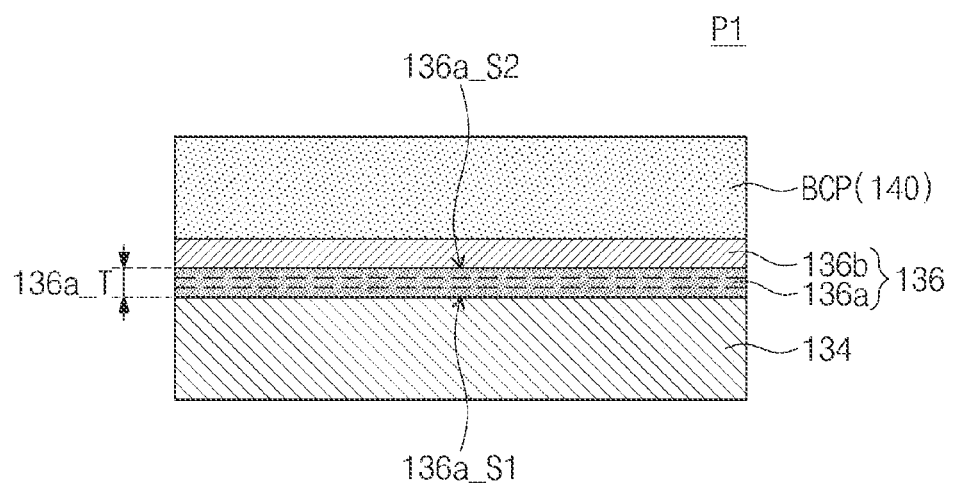
Figure 4C:
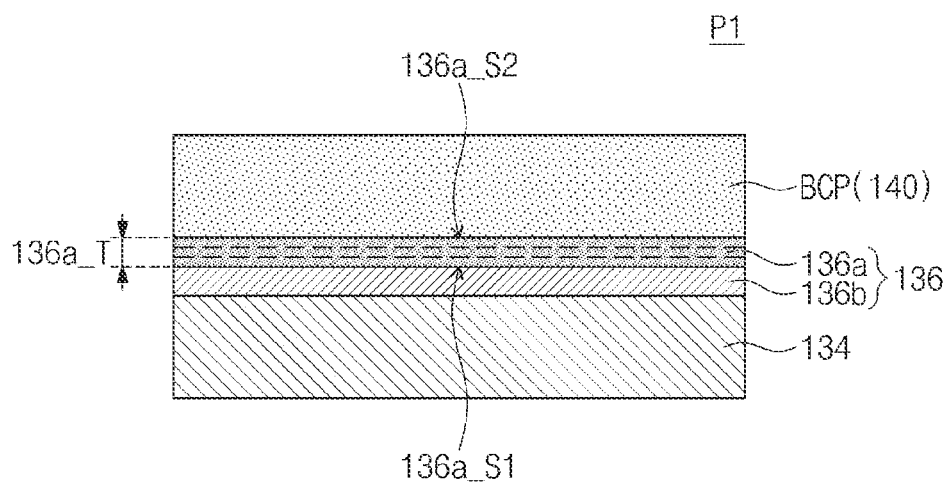

Referring to FIGS. 2, 4B and 4C, in some embodiments, the diffusion barrier pattern 136 may further include an upper barrier pattern 136b between the graphene pattern 136a and the bit line capping pattern BCP (i.e., the lower capping pattern 140 of the BCP) or between the graphene pattern 136a and the upper conductive pattern 134. The upper barrier pattern 136b may include a metal element. The upper barrier pattern 136b may include at least one of a conductive metal nitride or a metal silicide. For example, the upper barrier pattern 136b may include at least one of TiSiN, TiN, TaN, WN, or WSi.

In some embodiments, referring to FIG. 4B, the upper barrier pattern 136b may be between the graphene pattern 136a and the bit line capping pattern BCP (i.e., the lower capping pattern 140 of the BCP). In this case, the first surface 136a_S1 of the graphene pattern 136a may be in contact with the upper conductive pattern 134, and the second surface 136a_S2 of the graphene pattern 136a may be in contact with the upper barrier pattern 136b. The upper barrier pattern 136b may be between the second surface 136a_S2 of the graphene pattern 136a and the bit line capping pattern BCP (i.e., the lower capping pattern 140 of the BCP).

In certain embodiments, referring to FIG. 4C, the upper barrier pattern 136b may be between the graphene pattern 136a and the upper conductive pattern 134. In this case, the first surface 136a_S1 of the graphene pattern 136a may be in contact with the upper barrier pattern 136b, and the second surface 136a_S2 of the graphene pattern 136a may be in contact with the bit line capping pattern BCP (i.e., the lower capping pattern 140 of the BCP). The upper barrier pattern 136b may be between the first surface 136a_S1 of the graphene pattern 136a and the upper conductive pattern 134.

Figure 4D:
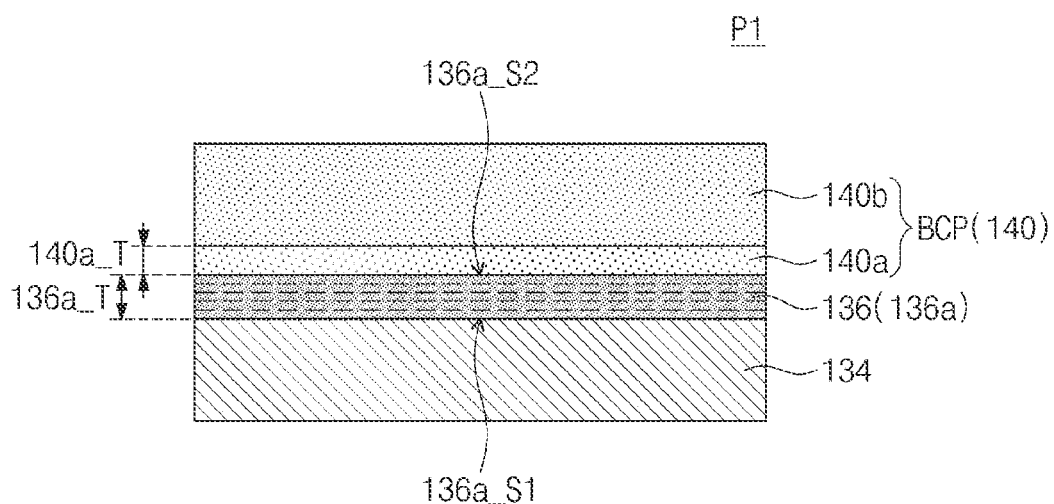

Referring to FIGS. 2 and 4D, in some embodiments, the lower capping pattern 140 of the bit line capping pattern BCP may include a first lower capping pattern 140a adjacent to the diffusion barrier pattern 136, and a second lower capping pattern 140b on the first lower capping pattern 140a. The first lower capping pattern 140a may be between the diffusion barrier pattern 136 and the second lower capping pattern 140b. The first lower capping pattern 140a may include a material deposited at a temperature lower than a deposition temperature of the second lower capping pattern 140b. For example, the first lower capping pattern 140a may include silicon nitride (SiN) deposited at a relatively low temperature (e.g., about 300 degrees Celsius), and the second lower capping pattern 140b may include silicon nitride (SiN) deposited at a relatively high temperature (e.g., about 630 degrees Celsius to about 740 degrees Celsius). A thickness 140a_T of the first lower capping pattern 140a in the fourth direction D4 may be less than a thickness of the second lower capping pattern 140b in the fourth direction D4. The diffusion barrier pattern 136 may include the graphene pattern 136a. In some embodiments, the first surface 136a_S1 of the graphene pattern 136a may be in contact with the upper conductive pattern 134, and the second surface 136a_S2 of the graphene pattern 136a may be in contact with the first lower capping pattern 140a.

Referring again to FIGS. 1, 2 and 3, bit line contacts DC may be under each of the bit lines BL and may be arranged in the first direction D1. The bit line contacts DC may be spaced apart from each other in the first direction D1 and may be between the lower conductive patterns 130 in the first direction D1. The lower conductive patterns 130 and the bit line contacts DC may be alternately arranged in the first direction D1. The bit line contacts DC may extend into and/or penetrate the insulating layer 120 and may be electrically connected to respective corresponding active patterns ACT of the active patterns ACT. Each of the bit line contacts DC may be electrically connected to the first dopant injection region 110a of each of the corresponding active patterns ACT. The upper conductive pattern 134 may extend in the first direction D1 on the lower conductive patterns 130 and the bit line contacts DC. The lower barrier pattern 132 may extend in the first direction D1 between the lower conductive patterns 130 and the upper conductive pattern 134 and between the bit line contacts DC and the upper conductive pattern 134. Upper surfaces of the bit line contacts DC in the fourth direction D4 may be coplanar with upper surfaces of the lower conductive patterns 130 in the fourth direction D4.

A bit line spacer 150 may be on side surfaces of each of the bit lines BL. The bit line spacer 150 may extend in the first direction D1 along a side surface of each of the bit lines BL. The bit line spacer 150 may include a first spacer 151, a second spacer 155 and a third spacer 157, which are sequentially stacked on the side surface of each of the bit lines BL. The first spacer 151 and the second spacer 155 may be on the insulating layer 120. The first spacer 151 may extend from the side surface of each of the bit lines BL to between the second spacer 155 and the insulating layer 120, and a bottommost surface of the first spacer 151 may be in contact with the top surface of the insulating layer 120. A bottommost surface of the second spacer 155 may be in contact with the first spacer 151. The third spacer 157 may at least partially cover a side surface of the insulating layer 120, and a bottommost surface of the third spacer 157 may be in contact with a top surface of the substrate 100.

The first spacer 151 and the third spacer 157 may include the same insulating material (e.g., silicon nitride), and the second spacer 155 may include a different material from that of the first spacer 151 and the third spacer 157. In some embodiments, the second spacer 155 may include an insulating material (e.g., silicon oxide) having an etch selectivity with respect to the first and third spacers 151 and 157. In certain embodiments, the second spacer 155 may be an air gap region.

A filling insulation pattern 153 may be on a side surface of each of the bit line contacts DC. The filling insulation pattern 153 may include at least one of silicon oxide, silicon nitride, or silicon oxynitride. The first spacer 151 may extend between the side surface of each of the bit line contacts DC and the filling insulation pattern 153 and may further extend between the device isolation layer 102 and the filling insulation pattern 153. An insulating liner 152 may be between the first spacer 151 and the filling insulation pattern 153. The filling insulation pattern 153 may be spaced apart from the first spacer 151 with the insulating liner 152 interposed therebetween. At least a portion of the insulating liner 152 may extend between the first spacer 151 and the third spacer 157 and may be in contact with the bottommost surface of the second spacer 155. The filling insulation pattern 153 may be in contact with the bottommost surface of the third spacer 157. In example embodiments, the insulating liner 152 may include silicon oxide.

One or more storage node contacts BC may be between a pair of bit lines BL adjacent to each other. The storage node contacts BC may be spaced apart from each other in the first direction D1 between the pair of bit lines BL and may be electrically connected to end portions of respective corresponding active patterns ACT of the active patterns ACT. Each of the storage node contacts BC may be electrically connected to the second dopant injection region 110b of each of the corresponding active patterns ACT. The storage node contacts BC may include dopant-doped or undoped polysilicon. Insulating fences may be between the storage node contacts BC. The insulating fences and the storage node contacts BC may be alternately arranged in the first direction D1 between the pair of bit lines BL. For example, the insulating fences may include silicon nitride.

The bit line spacer 150 may be between each of the bit lines BL and the storage node contacts BC. The first spacer 151 may be between the side surface of each of the bit lines BL and the second spacer 155, and the third spacer 157 may be between the second spacer 155 and the storage node contacts BC.

One of a plurality of landing pads LP may be on a corresponding one of the one or more storage node contacts BC. Each of the landing pads LP may include a metal-containing material such as tungsten. An upper portion of each of the landing pads LP may cover at least a portion of a top surface of the bit line capping pattern BCP (i.e., the upper capping pattern 142) and may have a width greater than that of each of the storage node contacts BC. The upper portion of each of the landing pads LP may be laterally shifted from each of the storage node contacts BC (e.g., in the second direction D2 or an opposite direction to the second direction D2). The upper portion of each of the landing pads LP may vertically overlap with a corresponding bit line BL of the plurality of bit lines BL. As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction. Even though not shown in the drawings, a storage node ohmic layer and a diffusion preventing pattern may be between each of the storage node contacts BC and each of the landing pads LP. The storage node ohmic layer may include a metal silicide. The diffusion preventing pattern may include a metal nitride such as titanium nitride and/or tantalum nitride.

A first upper insulating layer 160 may at least partially fill a space between the landing pads LP. The first upper insulating layer 160 may extend into and/or penetrate a portion of the bit line capping pattern BCP (e.g., portions of the upper capping pattern 142 and the lower capping pattern 140) and may be in contact with one or more of the top surfaces of the first to third spacers 151, 155 and 157. In example embodiments, the first upper insulating layer 160 may include at least one of silicon oxide, silicon nitride, or silicon oxynitride.

A capacitor structure CAP may be disposed on the landing pads LP. The capacitor structure CAP may include bottom electrodes BE on the landing pads LP, respectively, a top electrode TE covering at least a portion of the bottom electrodes BE, and a dielectric layer 175 between each of the bottom electrodes BE and the top electrode TE. Each of the bottom electrodes BE may have a circular pillar shape or a hollow cylinder or cup shape. The bottom electrodes BE may include at least one of dopant-doped polysilicon, a metal nitride (e.g., titanium nitride), or a metal (e.g., tungsten, aluminum and/or copper).

An upper support pattern 182 may support upper side surfaces of the bottom electrodes BE, and a lower support pattern 180 may support lower side surfaces of the bottom electrodes BE. The upper and lower support patterns 182 and 180 may include an insulating material such as silicon nitride, silicon oxide, and/or silicon oxynitride. An etch stop layer 170 may cover at least a portion of the first upper insulating layer 160 between the bottom electrodes BE. For example, the etch stop layer 170 may include an insulating material such as silicon nitride, silicon oxide, and/or silicon oxynitride.

The dielectric layer 175 may at least partially cover surfaces of the bottom electrodes BE and surfaces of the upper and lower support patterns 182 and 180. In example embodiments, the dielectric layer 175 may include at least one of a silicon oxide layer, a silicon nitride layer, a silicon oxynitride layer, or a high-k dielectric layer (e.g., a hafnium oxide layer). As used herein, the term "high-k dielectric" may refer to a material with a dielectric constant that is the same or higher than the dielectric constant of silicon dioxide. The top electrode TE may be on the dielectric layer 175 and may at least partially fill a space between the bottom electrodes BE and between the upper support pattern 182 and the lower support pattern 180. The top electrode TE may include at least one of a dopant-doped polysilicon layer, a dopant-doped silicon-germanium layer, a metal nitride layer (e.g., a titanium nitride layer), or a metal layer (e.g., tungsten, aluminum and/or copper).

If the upper conductive pattern 134 including ruthenium (Ru) is in direct contact with the bit line capping pattern BCP including the silicon compound in each of the bit lines BL, ruthenium silicide may be formed at an interface between the upper conductive pattern 134 and the bit line capping pattern BCP, and thus a resistance of the bit lines BL may be increased.

However, according to the present disclosure, the upper conductive pattern 134 of each of the bit lines BL may include ruthenium (Ru), and thus the bit lines BL may have a low resistance. In addition, the diffusion barrier pattern 136 may be between the upper conductive pattern 134 including ruthenium (Ru) and the bit line capping pattern BCP including the silicon compound, and the diffusion barrier pattern 136 may include the graphene pattern 136a. The graphene pattern 136a may include at least one graphene layer. The graphene may be a two-dimensional carbon material in which carbon atoms are bonded to each other in a honeycomb structure, and a distance between adjacent carbon atoms of the graphene may be less than a size of a silicon atom. Thus, the graphene pattern 136a may prevent silicon in the bit line capping pattern BCP from being diffused into the upper conductive pattern 134. As a result, it may be possible to prevent ruthenium silicide from being formed between the upper conductive pattern 134 and the bit line capping pattern BCP, and it may be possible to prevent an increase in resistance of the bit lines BL.

Thus, the semiconductor device with improved electrical characteristics and excellent reliability may be provided.

FIGS. 5, 8, 10, 12 and 14 are cross-sectional views corresponding to the line A-A' of FIG. 1 to illustrate a method of manufacturing a semiconductor device according to some embodiments of the present disclosure. FIGS. 6, 9, 11, 13 and 15 are cross-sectional views corresponding to the line B-B' of FIG. 1 to illustrate a method of manufacturing a semiconductor device according to some embodiments of the present disclosure. FIGS. 7A to 7D are enlarged views of a portion 'P2' of FIG. 5. Hereinafter, the descriptions to the same features as mentioned with reference to FIGS. 1, 2, 3 and 4A to 4D will be omitted for the purpose of ease and convenience in explanation.

Figure 5:
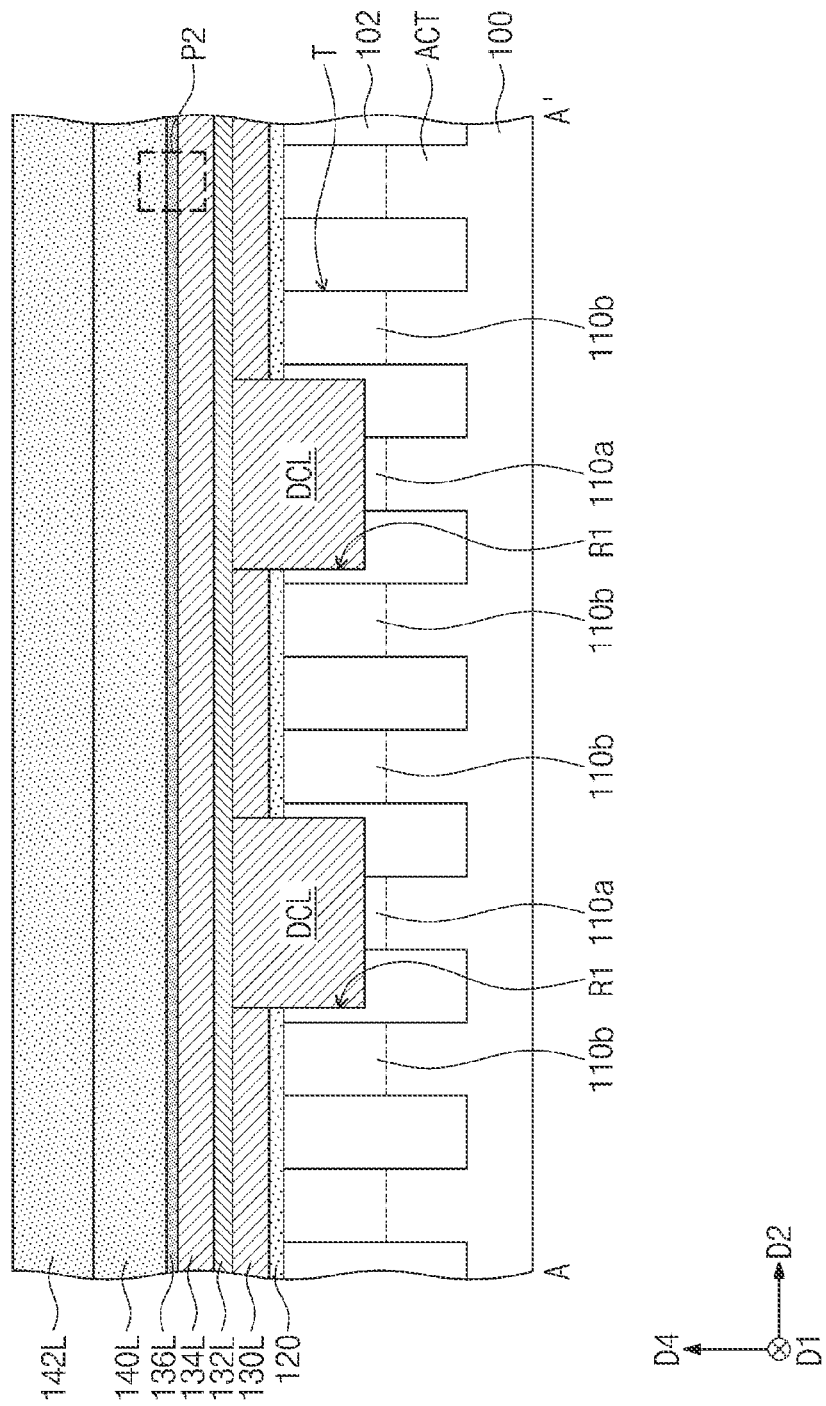
FIGS. 5, 8, 10, 12 and 14 are cross-sectional views corresponding to the line A-A' of FIG. 1 to illustrate a method of manufacturing a semiconductor device according to some embodiments of the present disclosure.
Figure 6:
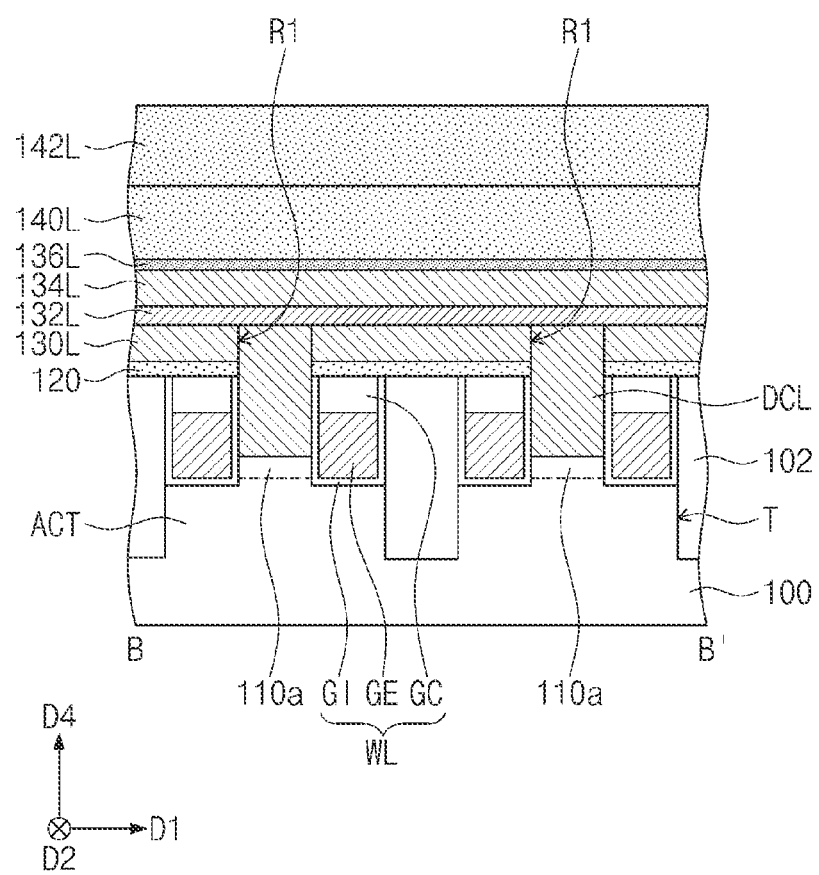
FIGS. 6, 9, 11, 13 and 15 are cross-sectional views corresponding to the line B-B' of FIG. 1 to illustrate a method of manufacturing a semiconductor device according to some embodiments of the present disclosure.

Referring to FIGS. 1, 5 and 6, active patterns ACT may be formed on the substrate 100. For example, the formation of the active patterns ACT may include forming first mask patterns on the substrate 100, and etching an upper portion of the substrate 100 using the first mask patterns as etch masks. Since the upper portion of the substrate 100 is etched, a trench T exposing side surfaces of the active patterns ACT may be formed in the substrate 100. A device isolation layer 102 may be formed to fill the trench T. For example, the formation of the device isolation layer 102 may include forming a device isolation insulating layer filling the trench T on the substrate 100, and planarizing the device isolation insulating layer to expose a top surface of the substrate 100.

Word lines WL may be formed in the substrate 100 and may intersect the active patterns ACT and the device isolation layer 102. The word lines WL may be spaced apart from each other in the first direction D1 and may extend in the second direction D2. Each of the word lines WL may include a gate electrode GE extending into and/or penetrating upper portions of the active patterns ACT and the device isolation layer 102, a gate dielectric pattern GI between the gate electrode GE and the active patterns ACT and between the gate electrode GE and the device isolation layer 102, and a gate capping pattern GC on a top surface of the gate electrode GE. For example, the formation of the gate electrode GE and the gate dielectric pattern GI may include forming grooves extending into and/or penetrating upper portions of the active patterns ACT and the device isolation layer 102 in the substrate 100, forming a gate dielectric layer at least partially covering inner surfaces of the grooves, forming a gate electrode layer at least partially filling the grooves, and planarizing the gate dielectric layer and the gate electrode layer to expose the top surface of the substrate 100. In example embodiments, the formation of the gate capping pattern GC may include recessing an upper portion of the gate electrode GE to form an empty region in each of the grooves, forming a gate capping layer at least partially filling the empty region, and planarizing the gate capping layer to expose the top surface of the substrate 100.

A first dopant injection region 110a and second dopant injection regions 110b may be formed in each of the active patterns ACT. For example, the formation of the first and second dopant injection regions 110a and 110b may include implanting dopants having the same conductivity type into the active patterns ACT using the gate capping pattern GC and the device isolation layer 102 as masks.

An insulating layer 120 may be formed on the substrate 100 and may cover at least a portion of the active patterns ACT, the device isolation layer 102 and the word lines WL. A lower conductive layer 130L may be stacked on the insulating layer 120. Recess regions R1 may be formed to penetrate the insulating layer 120 and the lower conductive layer 130L and to extend into the active patterns ACT and the device isolation layer 102. For example, the formation of the recess regions R1 may include forming a second mask pattern defining regions, in which the recess regions R1 will be formed, on the lower conductive layer 130L, and etching the lower conductive layer 130L, the insulating layer 120, the active patterns ACT and the device isolation layer 102 using the second mask pattern as an etch mask. The second mask pattern may be removed after the formation of the recess regions R1.

A bit line contact layer DCL may be formed to at least partially fill the recess regions R1. For example, the formation of the bit line contact layer DCL may include forming the bit line contact layer DCL at least partially filling the recess regions R1 on the lower conductive layer 130L, and planarizing the bit line contact layer DCL to expose a top surface of the lower conductive layer 130L. Thus, the bit line contact layer DCL may be locally formed in the recess regions R1.

A lower barrier layer 132L, an upper conductive layer 134L, a diffusion barrier layer 136L, a lower capping layer 140L, and an upper capping layer 142L may be sequentially stacked on the lower conductive layer 130L and may each extend onto the bit line contact layer DCL. The lower barrier layer 132L may cover at least a portion of top surfaces of the lower conductive layer 130L and the bit line contact layer DCL. Each of the lower barrier layer 132L, the upper conductive layer 134L, the diffusion barrier layer 136L, the lower capping layer 140L, and the upper capping layer 142L may be formed using a physical vapor deposition (PVD) method, a chemical vapor deposition (CVD) method, or an atomic layer deposition (ALD) method.

Figure 7A:
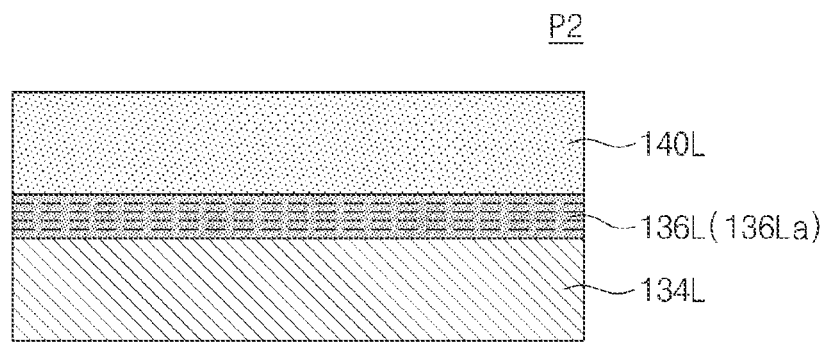
FIGS. 7A to 7D are enlarged views of a portion 'P2' of FIG. 5.

Referring to FIGS. 5 and 7A, the diffusion barrier layer 136L may include a graphene thin layer 136La. The graphene thin layer 136La may be a single graphene layer between the upper conductive layer 134L and the lower capping layer 140L or may include a plurality of graphene layers stacked in the fourth direction D4 between the upper conductive layer 134L and the lower capping layer 140L. For example, the graphene thin layer 136La may be formed by a chemical vapor deposition (CVD) method using microwave plasma, inductively coupled plasma (ICP), capacitively coupled plasma (CCP) or pulsed plasma, a thermal chemical vapor deposition (thermal CVD) method, or an atomic layer deposition (ALD) method.

Figure 7B:
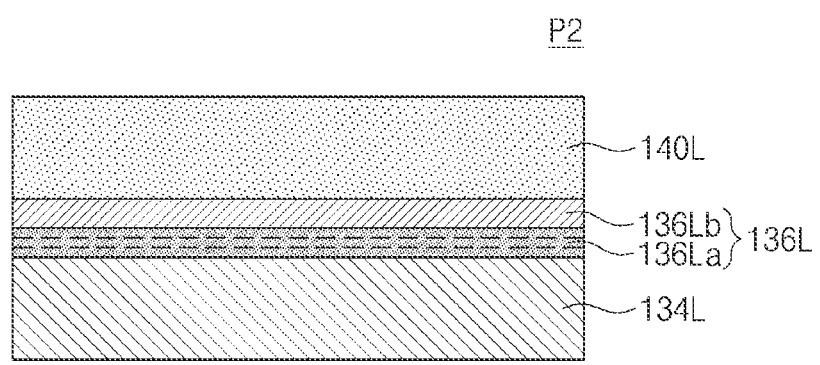
Figure 7C:
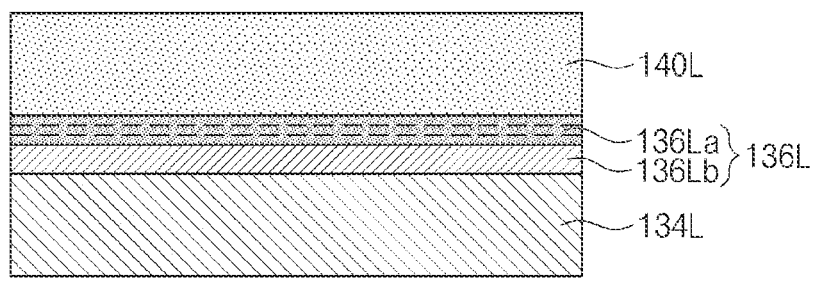

Referring to FIGS. 5, 7B and 7C, according to some embodiments, the diffusion barrier layer 136L may further include an upper barrier layer 136Lb between the graphene thin layer 136La and the lower capping layer 140L or between the graphene thin layer 136La and the upper conductive layer 134L. The upper barrier layer 136Lb may be formed using a physical vapor deposition (PVD) method, a chemical vapor deposition (CVD) method, or an atomic layer deposition (ALD) method. For some examples, referring to FIG. 7B, the upper barrier layer 136Lb may be formed between the graphene thin layer 136La and the lower capping layer 140L. For certain examples, referring to FIG. 7C, the upper barrier layer 136Lb may be formed between the graphene thin layer 136La and the upper conductive layer 134L.

Figure 7D:
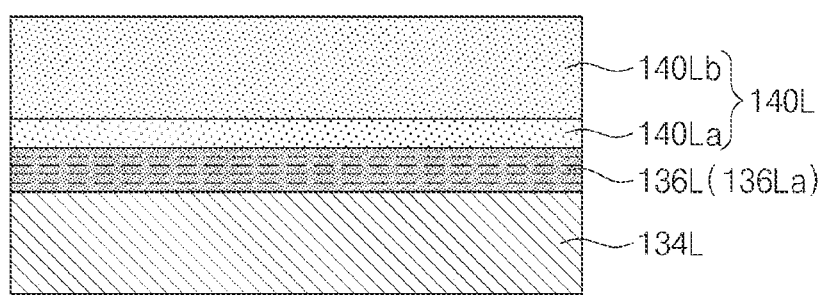

Referring to FIGS. 5 and 7D, according to some embodiments, the lower capping layer 140L may include a first lower capping layer 140La adjacent to the diffusion barrier layer 136L, and a second lower capping layer 140Lb on the first lower capping layer 140La. The first lower capping layer 140La may be formed between the diffusion barrier layer 136L and the second lower capping layer 140Lb. A deposition process of the first lower capping layer 140La may be performed at a temperature lower than that of a deposition process of the second lower capping layer 140Lb. For example, the first lower capping layer 140La may include silicon nitride (SiN) deposited at a relatively low temperature (e.g., about 300 degrees Celsius), and the second lower capping layer 140Lb may include silicon nitride (SiN) deposited at a relatively high temperature (e.g., about 630 degrees Celsius to about 740 degrees Celsius).

Each of the lower capping layer 140L and the upper capping layer 142L may include a silicon compound. When the first lower capping layer 140La is formed by the low-temperature deposition process, it is possible to inhibit silicon in the lower capping layer 140L from being diffused into the upper conductive layer 134L.

Figure 8:
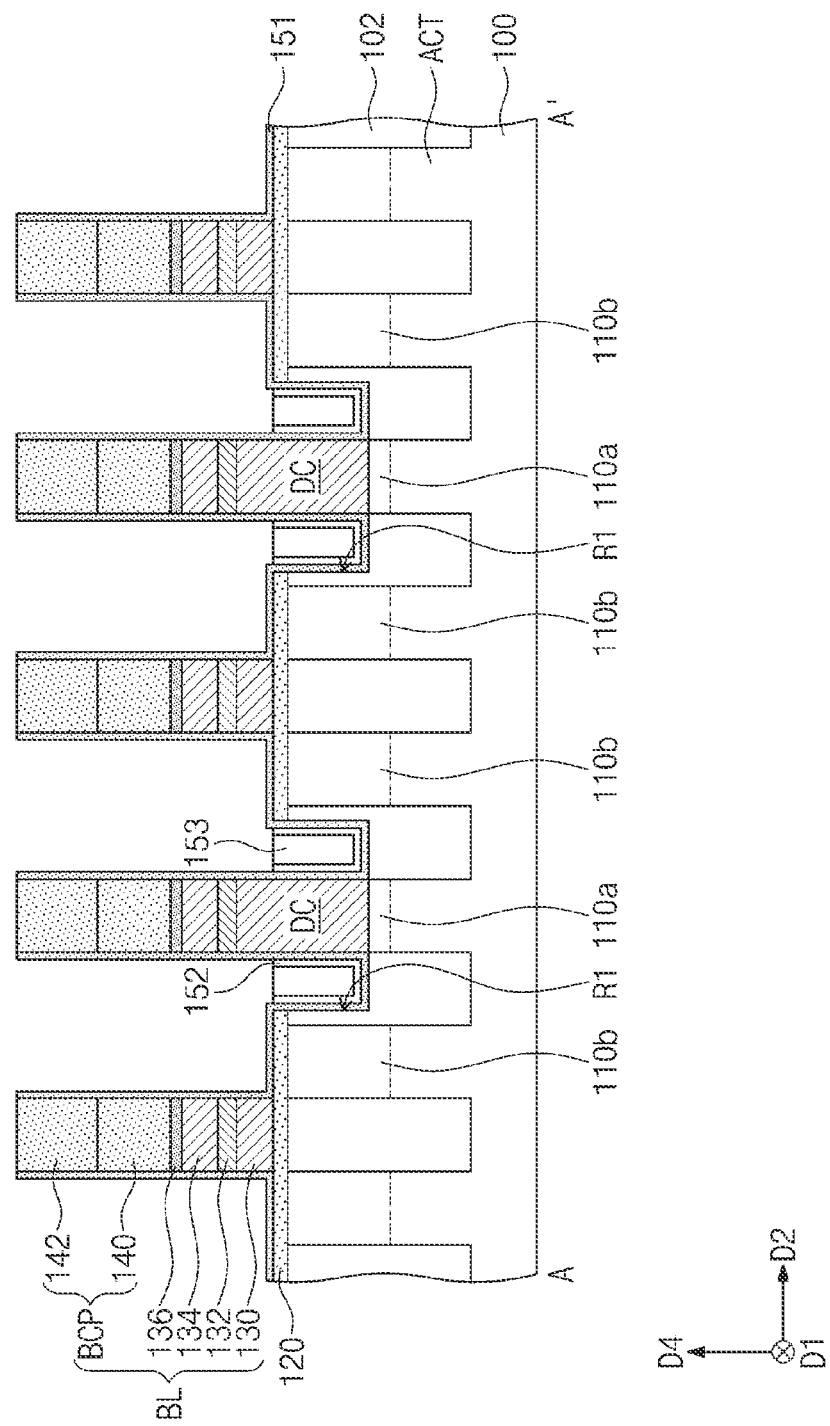
Figure 9:
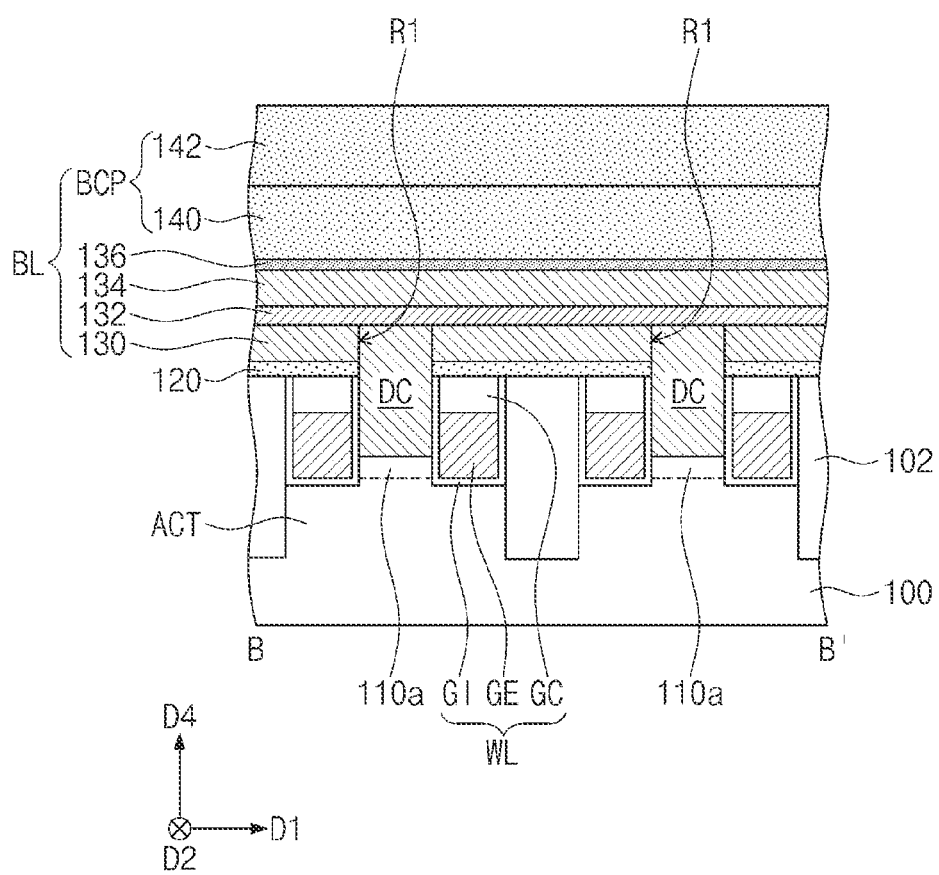

Referring to FIGS. 1, 8 and 9, the upper capping layer 142L, the lower capping layer 140L, the diffusion barrier layer 136L, the upper conductive layer 134L, the lower barrier layer 132L and the lower conductive layer 130L may be sequentially etched to form bit lines BL. The bit lines BL may be formed on the insulating layer 120 and may intersect the word lines WL. The bit lines BL may extend in the first direction D1 and may be spaced apart from each other in the second direction D2. Each of the bit lines BL may include an upper capping pattern 142, a lower capping pattern 140, a diffusion barrier pattern 136, an upper conductive pattern 134, a lower barrier pattern 132, and lower conductive patterns 130, which are formed by etching the upper capping layer 142L, the lower capping layer 140L, the diffusion barrier layer 136L, the upper conductive layer 134L, the lower barrier layer 132L, and the lower conductive layer 130L, respectively. The upper capping pattern 142 and the lower capping pattern 140 may be referred to as a bit line capping pattern BCP. The lower conductive patterns 130 of each of the bit lines BL may be arranged to be spaced apart from each other in the first direction D1 on the insulating layer 120.

Bit line contacts DC may be formed under each of the bit lines BL and may be spaced apart from each other in the first direction D1. The lower conductive patterns 130 and the bit line contacts DC may be alternately arranged in the first direction D1. The bit line contacts DC may be formed by etching the bit line contact layer DCL. An inner surface of each of the recess regions R1 may be exposed at both sides of each of the bit line contacts DC.

A first spacer 151 may be formed on a side surface of each of the bit lines BL and may extend onto the insulating layer 120. The first spacer 151 may extend onto a side surface of each of the bit line contacts DC and may cover at least a portion of the exposed inner surface of each of the recess regions R1. An insulating liner 152 and a filling insulation pattern 153 may be formed at both sides of each of the bit line contacts DC and may be formed to fill a remaining portion of each of the recess regions R1. The insulating liner 152 may be between the first spacer 151 and the filling insulation pattern 153.

For example, the formation of the first spacer 151, the insulating liner 152, and the filling insulation pattern 153 may include forming a first spacer layer covering at least a portion of the side surface of each of the bit lines BL, the side surface of each of the bit line contacts DC, and the exposed inner surface of each of the recess regions R1, forming an insulating liner layer extending along the first spacer layer on the first spacer layer, forming a filling insulation layer filling a remaining portion of each of the recess regions R1, and anisotropically etching the filling insulation layer, the insulating liner layer and the first spacer layer.

Figure 10:
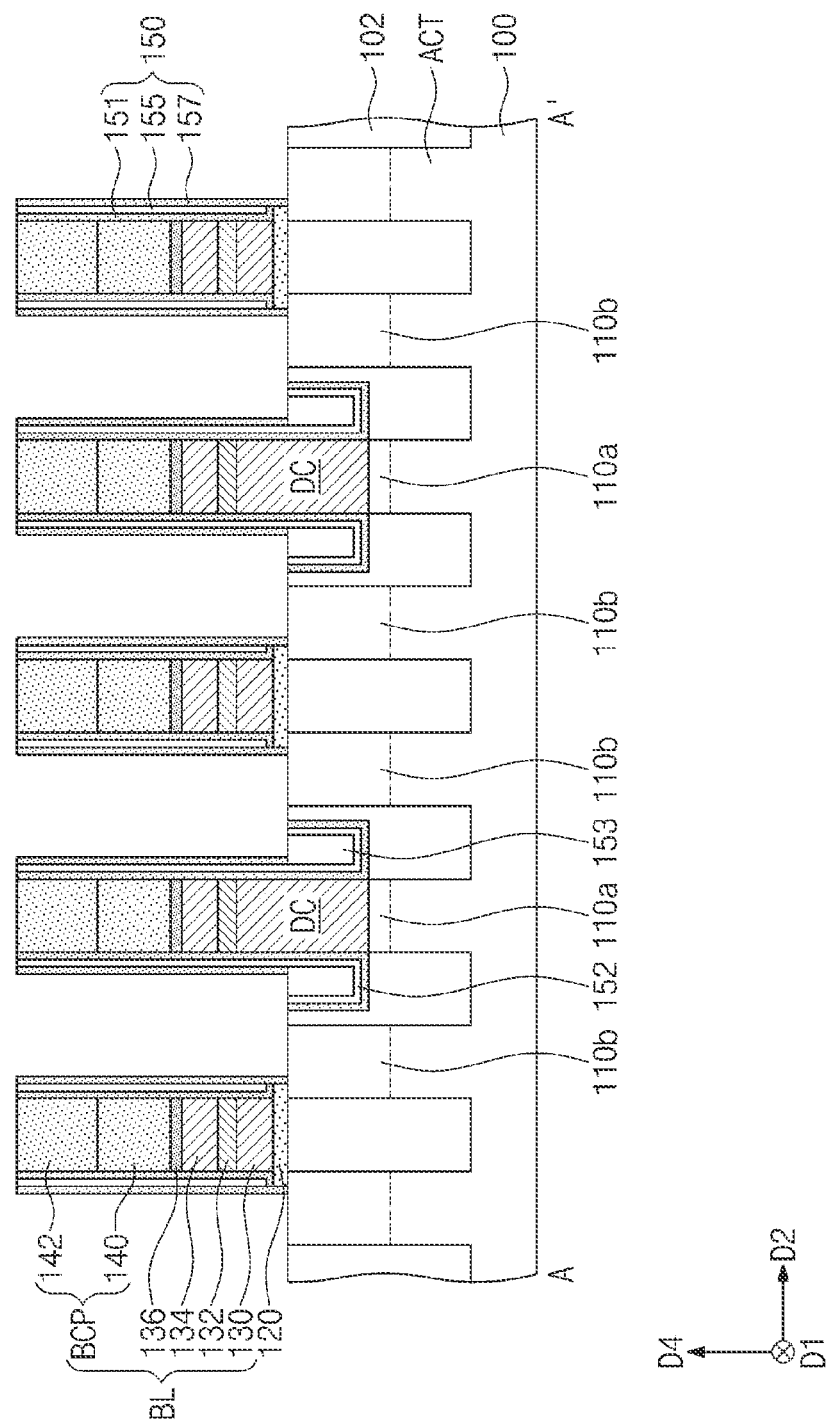
Figure 11:
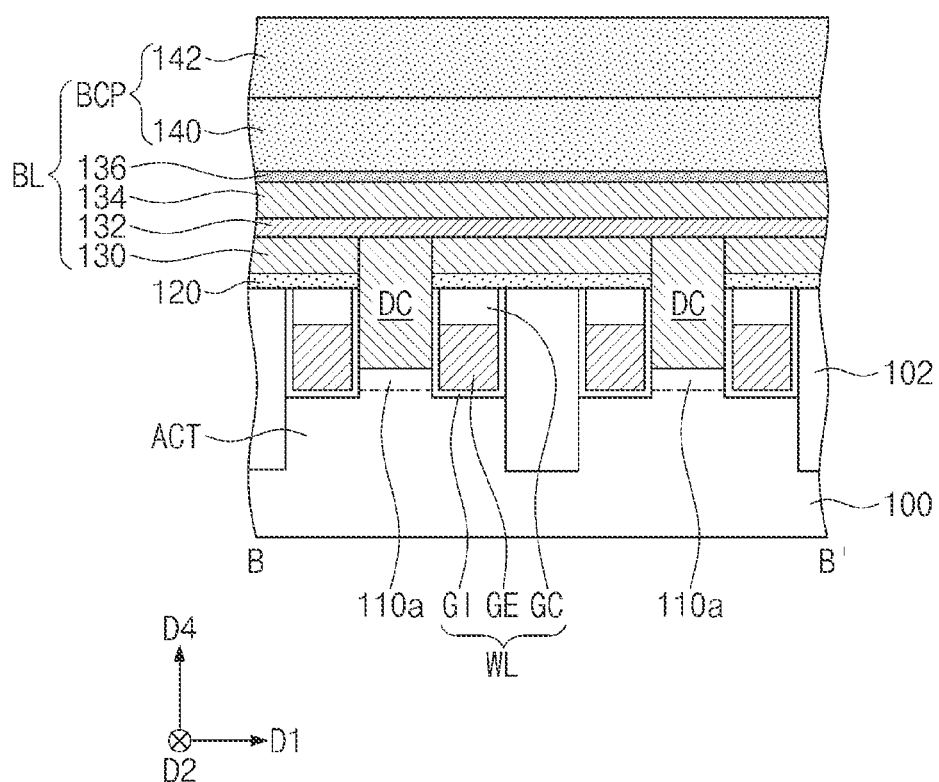

Referring to FIGS. 1, 10 and 11, a second spacer 155 may be formed on the side surface of each of the bit lines BL. The first spacer 151 may be between the side surface of each of the bit lines BL and the second spacer 155 and may extend between a top surface of the insulating layer 120 and the second spacer 155. For example, the formation of the second spacer 155 may include forming a second spacer layer covering at least a portion of the side surface of each of the bit lines BL, and anisotropically etching the second spacer layer. A portion of the insulating layer 120, which is exposed by the second spacer 155, may also be etched in the anisotropic etching process of the second spacer layer.

A third spacer 157 may be formed on the side surface of each of the bit lines BL. The first and second spacers 151 and 155 may be between the side surface of each of the bit lines BL and the third spacer 157. The third spacer 157 may cover at least a portion of a side surface of the insulating layer 120 and may be in contact with a top surface of the substrate 100 and a top surface of the filling insulation pattern 153. The third spacer 157 may be formed by substantially the same method as the second spacer 155.

The first to third spacers 151, 155 and 157 may constitute a bit line spacer 150. The bit line spacer 150 may extend in the first direction D1 along the side surface of each of the bit lines BL.

Figure 12:
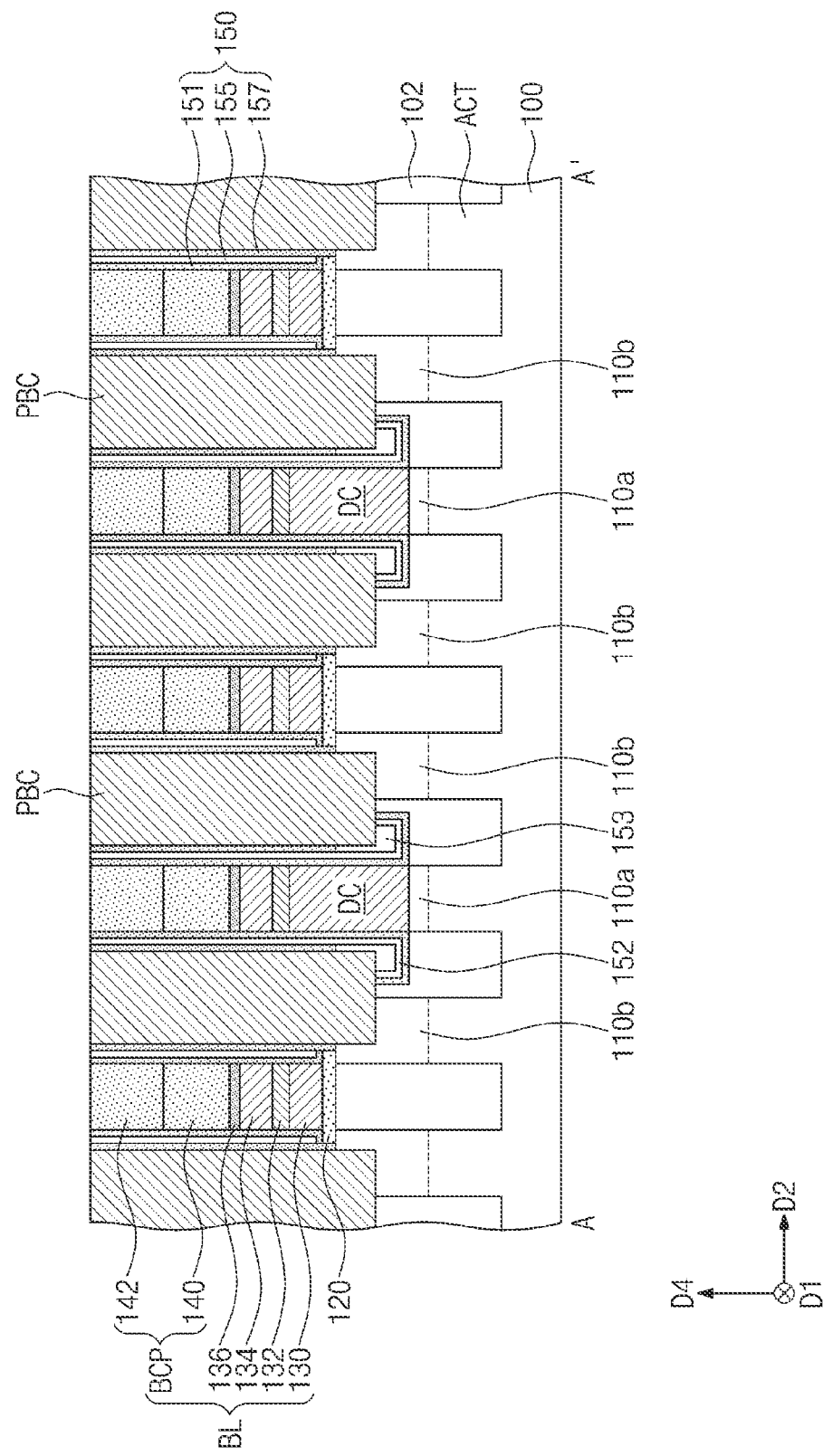
Figure 13:
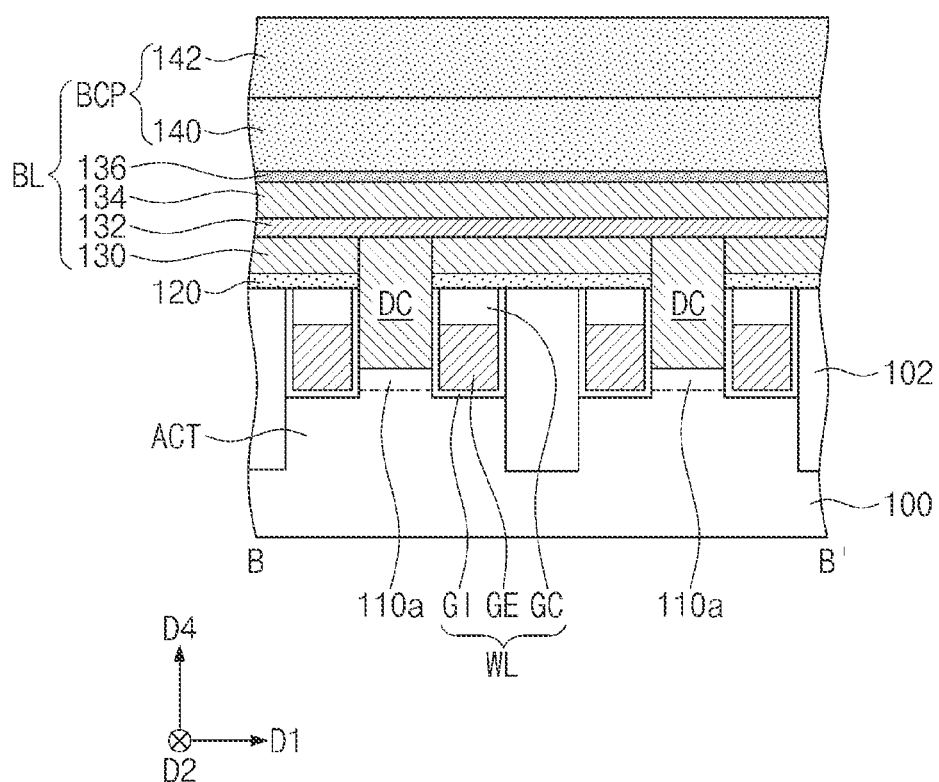

Referring to FIGS. 1, 12 and 13, a preliminary contact layer PBC may be formed on the substrate 100 and between the bit lines BL. The bit line spacer 150 may be between each of the bit lines BL and the preliminary contact layer PBC. For example, the formation of the preliminary contact layer PBC may include forming a contact conductive layer at least partially filling a space between the bit lines BL on the substrate 100, and planarizing the contact conductive layer to expose a top surface of the upper capping pattern 142. The preliminary contact layer PBC may extend in the first direction D1 between a pair of the bit lines BL adjacent to each other.

Figure 14:
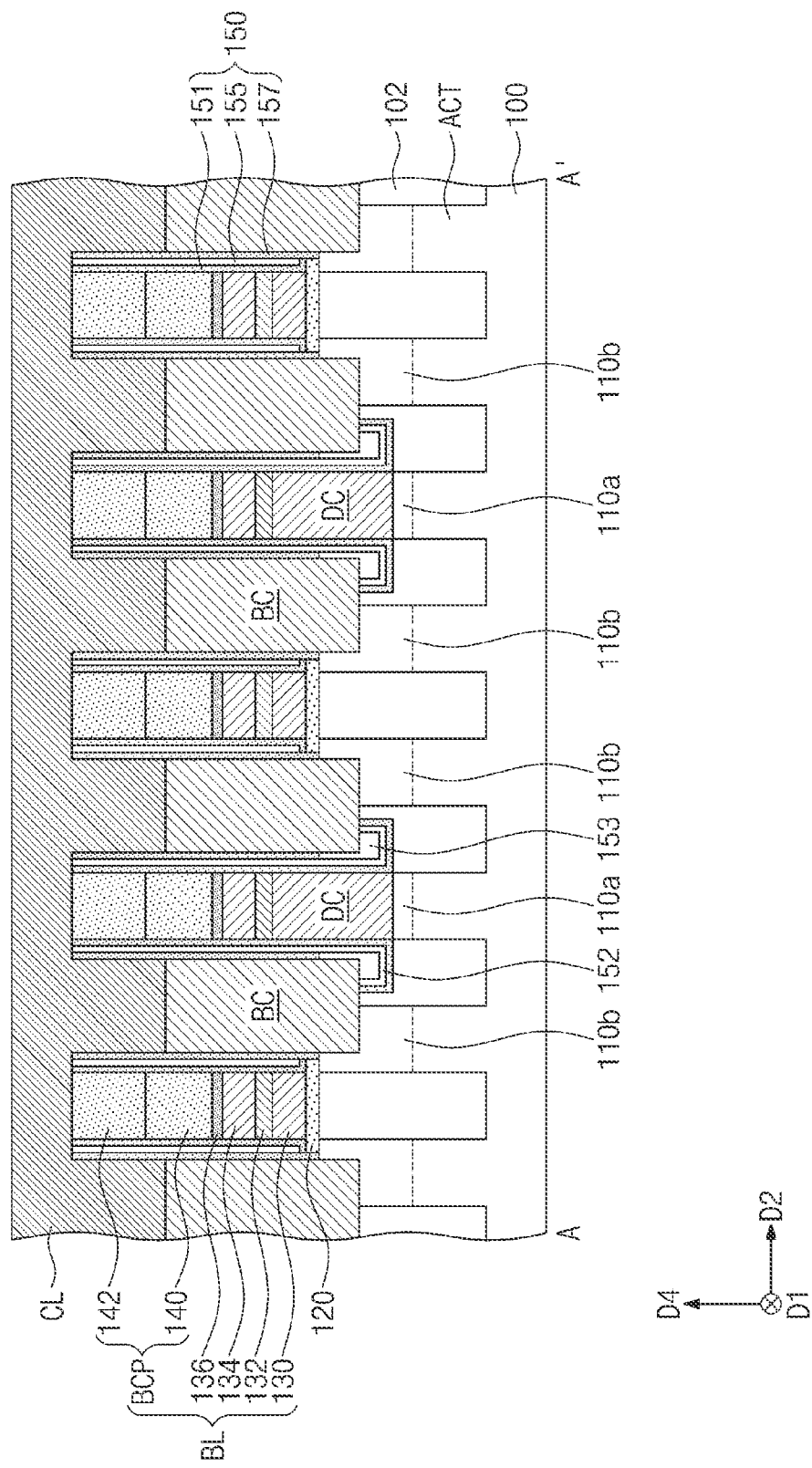
Figure 15:
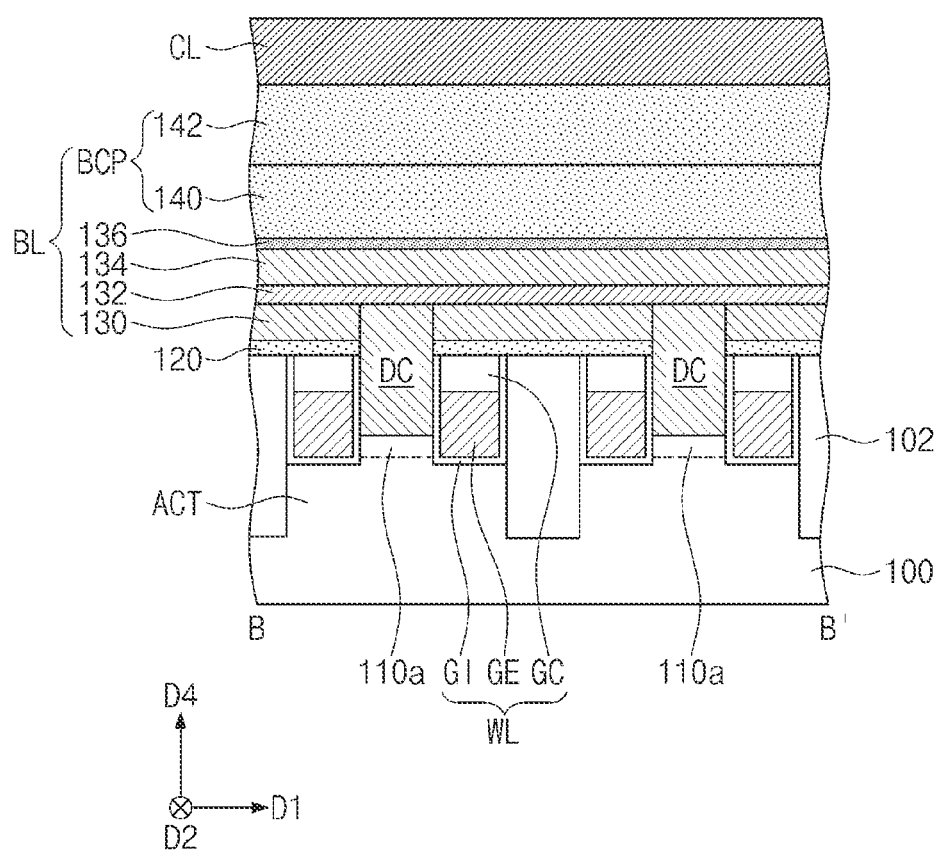

Referring to FIGS. 1, 14 and 15, an upper portion of the preliminary contact layer PBC may be recessed. Thereafter, storage node contacts BC may be formed by patterning the preliminary contact layer PBC. The storage node contacts BC may be spaced apart from each other in the first direction D1 between the pair of bit lines BL adjacent to each other. Insulating fences may be formed between the storage node contacts BC. The insulating fences and the storage node contacts BC may be alternately arranged in the first direction D1 between the pair of bit lines BL. A conductive layer CL may be formed on the substrate 100 to cover at least a portion of top surfaces of the bit lines BL, the storage node contacts, BC and the insulating fences.

Referring again to FIGS. 1, 2 and 3, landing pads LP may be formed by patterning the conductive layer CL. A first upper insulating layer 160 may be formed to at least partially fill a space between the landing pads LP.

An etch stop layer 170 may be formed on the landing pads LP and the first upper insulating layer 160. Bottom electrodes BE may be formed on respective ones of the landing pads LP. Each of the bottom electrodes BE may extend into and/or penetrate the etch stop layer 170 so as to be connected to a corresponding landing pad LP of the landing pads LP.

An upper support pattern 182 may be formed on upper side surfaces of the bottom electrodes BE and may support the upper side surfaces of the bottom electrodes BE. A lower support pattern 180 may be formed on lower side surfaces of the bottom electrodes BE and may support the lower side surfaces of the bottom electrodes BE. A dielectric layer 175 may be formed to at least partially cover surfaces of the bottom electrodes BE and surfaces of the upper and lower support patterns 182 and 180. A top electrode TE may be formed on the substrate 100 and may at least partially fill a space between the bottom electrodes BE. The bottom electrodes BE, the dielectric layer 175, and the top electrode TE may constitute a capacitor structure CAP.

Figure 16:
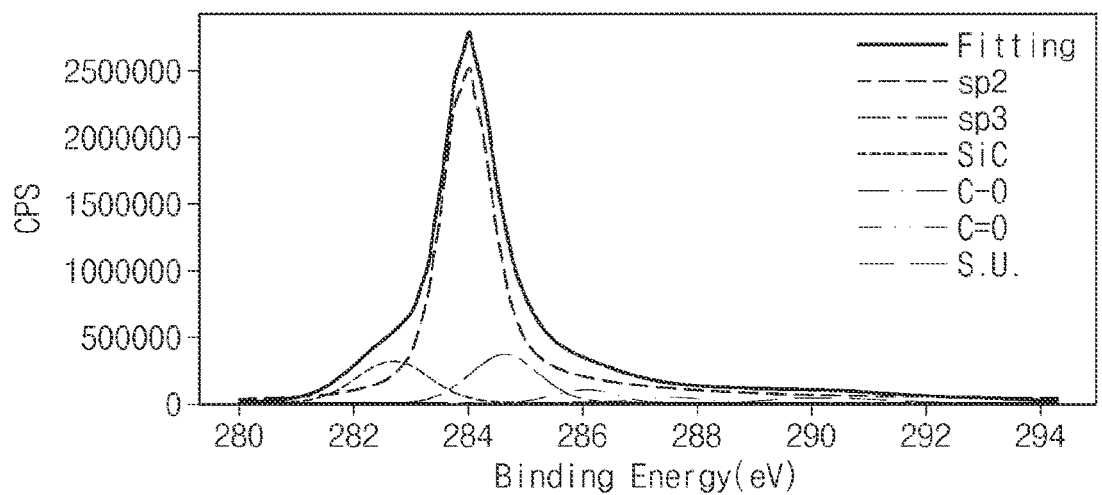
FIG. 16 is an XPS graph of a graphene pattern in a diffusion barrier pattern of FIG. 1.
Figure 17:
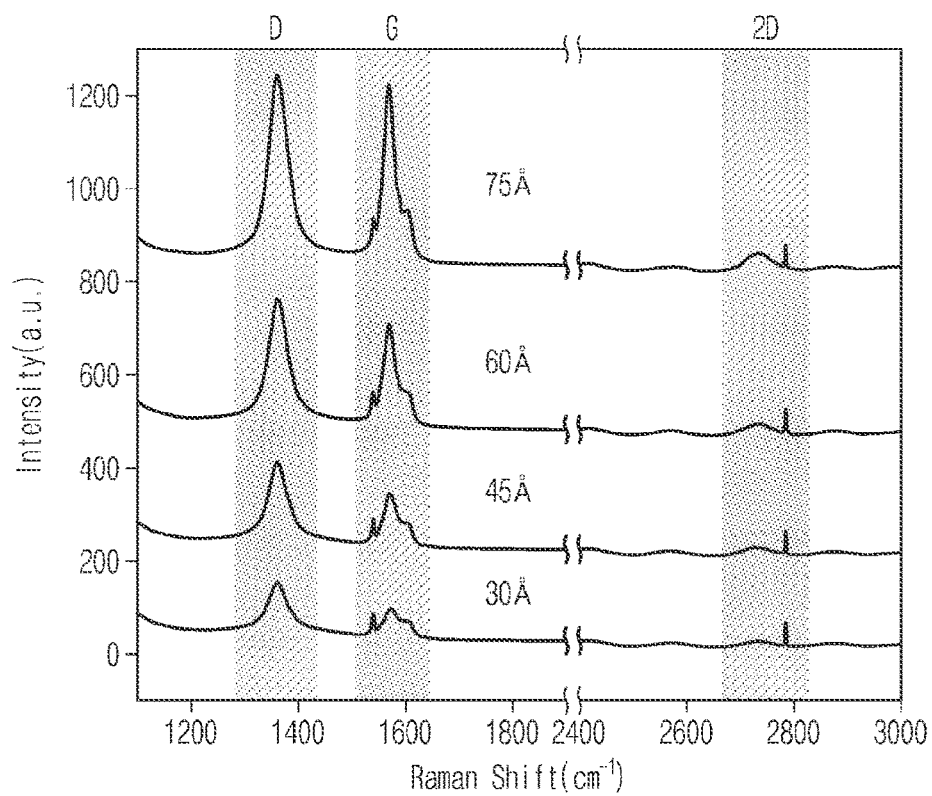
FIG. 17 is a graph showing a Raman peak of a graphene pattern in a diffusion barrier pattern of FIG. 1.

FIG. 16 is an XPS graph of a graphene pattern in a diffusion barrier pattern of FIG. 1, and FIG. 17 is a graph showing a Raman peak of a graphene pattern in a diffusion barrier pattern of FIG. 1.

Referring to FIG. 16, sp2 bonds in the graphene pattern 136*a* may be about 50% or more of total bonds (fitting) in the graphene pattern 136*a*. For example, the sp2 bonds in the graphene pattern 136*a* may be equal to or greater than 50% of the total bonds (fitting) in the graphene pattern 136*a* and may be less than 100% of the total bonds (fitting).

Referring to FIG. 17, as a thickness of the graphene pattern 136*a* increases, an intensity of a G peak may increase. The G peak may be a peak shown in common in graphite-based materials and may correspond to a mode in which carbon atoms of a hexagonal structure vibrate in opposite directions to vibration directions of adjacent atoms. A D peak and a 2D peak may be peaks caused by defects in the graphene pattern 136*a*. According to some embodiments of the present disclosure, the graphene pattern 136*a* may satisfy a condition that a value of (D peak intensity)/(G peak intensity) is equal to or less than 2.0, and a condition that a value of (2D peak intensity)/(G peak intensity) is equal to or greater than 0.1.

According to some embodiments of the present disclosure, the bit line may include a diffusion barrier pattern between a bit line capping pattern and an upper conductive pattern including ruthenium (Ru), and the diffusion barrier pattern may include a graphene pattern. Since the upper conductive pattern includes ruthenium (Ru), the bit line may have a low resistance. In addition, the graphene pattern may prevent silicon in the bit line capping pattern from being diffused into the upper conductive pattern, and thus an increase in resistance of the bit line may be prevented. As a result, the semiconductor device with improved electrical characteristics and excellent reliability may be provided.

While example embodiments of the present disclosure have been particularly shown and described, it will be understood by one of ordinary skill in the art that variations in form and detail may be made therein without departing from the spirit and scope of the attached claims.

What is claimed is:

1. A semiconductor device comprising:
a substrate comprising a plurality of active patterns;
a bit line intersecting at least one of the plurality of active patterns on the substrate and extending in a first direction,
wherein the bit line comprises:
a first conductive pattern extending in the first direction;
a bit line capping pattern extending in the first direction on the first conductive pattern; and
a graphene pattern extending in the first direction between the first conductive pattern and the bit line capping pattern,
wherein the first conductive pattern includes ruthenium (Ru).

2. The semiconductor device of claim 1, further comprising one or more bit line contacts arranged in the first direction under the bit line, the one or more bit line contacts electrically connected to a respective one of the plurality of active patterns,
wherein the first conductive pattern extends in the first direction on the one or more bit line contacts, and
wherein the bit line further comprises:
one or more second conductive patterns between the one or more bit line contacts under the first conductive pattern; and
a lower barrier pattern extending in the first direction between the first conductive pattern and the one or more second conductive patterns and between the first conductive pattern and the one or more bit line contacts,
wherein the one or more second conductive patterns and the one or more bit line contacts are alternately arranged in the first direction.

3. The semiconductor device of claim 1, wherein the bit line capping pattern comprises a silicon compound.

4. The semiconductor device of claim 1, further comprising a barrier pattern between the first conductive pattern and the graphene pattern or between the bit line capping pattern and the graphene pattern.

5. The semiconductor device of claim 4, wherein the barrier pattern comprises at least one of a conductive metal nitride or a metal silicide.

6. The semiconductor device of claim 1, wherein the bit line capping pattern comprises: a first lower capping pattern adjacent to the graphene pattern; and
a second lower capping pattern on the first lower capping pattern,
wherein the first lower capping pattern comprises a material deposited at a lower temperature than a deposition temperature of the second lower capping pattern,
wherein each of the first lower capping pattern and the second lower capping pattern has a thickness in a direction perpendicular to a bottom surface of the substrate, and
wherein the thickness of the first lower capping pattern is less than the thickness of the second lower capping pattern.

7. The semiconductor device of claim 1, wherein the graphene pattern comprises a plurality of graphene layers stacked in a direction perpendicular to a bottom surface of the substrate, and wherein one or more of the plurality of graphene layers has a thickness equal to or less than one hundred Angstroms (100 Å), and has a first surface and a second surface, which are opposite to each other, the first surface being in contact with the first conductive pattern, and the second surface being in contact with the bit line capping pattern.

8. The semiconductor device of claim 1, wherein the bit line is one of a plurality of bit lines,
wherein the plurality of bit lines extend in the first direction and are spaced apart from each other in a second direction intersecting the first direction, and
wherein the first direction and the second direction are parallel to a bottom surface of the substrate.

9. The semiconductor device of claim 8, further comprising:
a plurality of storage node contacts spaced apart from each other in the first direction between a pair of bit lines, adjacent to each other, of the plurality of bit lines,
wherein each of the plurality of storage node contacts is connected to an end portion of a corresponding active pattern of the plurality of active patterns.

10. The semiconductor device of claim 9, further comprising:
- a capacitor structure connected to one or more of the plurality of storage node contacts, wherein the capacitor structure comprises:
  - a plurality of bottom electrodes, with each of the plurality of bottom electrodes connected to a respective one of the plurality of storage node contacts;
  - a top electrode at least partially covering one or more of the plurality of bottom electrodes; and
  - a dielectric layer between each of the plurality of bottom electrodes and the top electrode.

11. The semiconductor device of claim 9, further comprising:
- a bit line spacer covering at least a portion of side surfaces of one or more of the plurality of bit lines and extending in the first direction,
- wherein the bit line spacer comprises a first spacer, a second spacer, and a third spacer, which are sequentially stacked on a side surface of one or more of the plurality of bit lines,
- wherein the first spacer is between the side surface of one or more of the plurality of bit lines and the second spacer, and
- wherein the third spacer is between the second spacer and one or more of the plurality of storage node contacts.

12. The semiconductor device of claim 11, wherein the second spacer comprises at least one different material from that of the first spacer and the third spacer.

13. A semiconductor device comprising:
- a substrate comprising a plurality of active patterns;
- a plurality of bit lines intersecting at least one of the plurality of active patterns on the substrate, the plurality of bit lines extending in a first direction and spaced apart from each other in a second direction, the first and second directions being parallel to a bottom surface of the substrate and intersecting each other;
- one or more bit line contacts arranged in the first direction under each of the plurality of bit lines, each of the one or more bit line contacts electrically connected to a respective corresponding active pattern of the plurality of active patterns;
- a plurality of storage node contacts spaced apart from each other in the first direction between the plurality of bit lines, each of the plurality of storage node contacts electrically connected to end portions of a respective corresponding active pattern of the plurality of active patterns; and
- a capacitor structure connected to one or more of the plurality of storage node contacts,
- wherein each of the plurality of bit lines comprises:
  - a first conductive pattern comprising ruthenium (Ru) and extending in the first direction on the one or more bit line contacts;
  - a bit line capping pattern comprising a silicon compound and extending in the first direction on the first conductive pattern; and
  - a graphene pattern extending in the first direction between the first conductive pattern and the bit line capping pattern.

14. The semiconductor device of claim 13, wherein each of the plurality of bit lines further comprises:
- one or more second conductive patterns between the one or more bit line contacts under the first conductive pattern; and
- a lower barrier pattern extending in the first direction between the first conductive pattern and the one or more second conductive patterns and between the first conductive pattern and the one or more bit line contacts.

15. The semiconductor device of claim 13, further comprising a barrier pattern between the first conductive pattern and at least one graphene pattern or between the bit line capping pattern and the at least one graphene pattern, and wherein the barrier pattern comprises a metal element.

16. The semiconductor device of claim 13, wherein the graphene pattern is part of a diffusion barrier pattern, and wherein the bit line capping pattern comprises:
- a first lower capping pattern adjacent to the diffusion barrier pattern; and
- a second lower capping pattern on the first lower capping pattern,
- wherein each of the first lower capping pattern and the second lower capping pattern has a thickness in a direction perpendicular to the bottom surface of the substrate, and
- wherein the thickness of the first lower capping pattern is less than the thickness of the second lower capping pattern.

17. The semiconductor device of claim 16, wherein each of the first lower capping pattern and the second lower capping pattern comprises the silicon compound.

18. The semiconductor device of claim 13, wherein at least one graphene pattern comprises a plurality of graphene layers stacked in a direction perpendicular to the bottom surface of the substrate, wherein a number of the plurality of graphene layers is a range from two to about twenty layers.

19. The semiconductor device of claim 13, further comprising:
- a plurality of word lines in the substrate and intersecting at least one of the plurality of active patterns,
- wherein the plurality of word lines extend in the second direction and are spaced apart from each other in the first direction,
- wherein each of the plurality of active patterns includes a first dopant injection region between a pair of word lines of the plurality of word lines, and
- wherein each of the one or more bit line contacts is connected to the first dopant injection region.

20. A semiconductor device comprising:
- a substrate comprising a plurality of active patterns;
- a plurality of bit lines intersecting at least one of the plurality of active patterns on the substrate, the plurality of bit lines extending in a first direction and spaced apart from each other in a second direction, the first and second directions being parallel to a bottom surface of the substrate and intersecting each other; and
- one or more bit line contacts arranged in the first direction under each of the plurality of bit lines, each of the one or more bit line contacts electrically connected to a respective corresponding active pattern of the plurality of active patterns;
- wherein each of the plurality of bit lines comprises:
  - a conductive pattern comprising ruthenium (Ru) and extending in the first direction on the one or more bit line contacts;
  - a bit line capping pattern comprising a silicon compound and extending in the first direction on the conductive pattern; and
  - at least one graphene pattern extending in the first direction between the conductive pattern and the bit line capping pattern,
- wherein the at least one graphene pattern comprises at least one graphene layer having a two-dimensional carbon material in which carbon atoms are bonded to each other in a honeycomb structure, and a distance between adjacent carbon atoms of the graphene layer is less than a size of a silicon atom, wherein the graphene pattern is configured to prevent ruthenium silicide from being formed between the conductive pattern and the bit line capping pattern.

* * * * *